United States Patent Office 3,416,922

Patented Dec. 17, 1968

3,416,922

RESINOUS PRINTING PLATE COMPOSITIONS CONTAINING LIGHT-SENSITIVE NITRONES

Oskar Süs and Johannes Munder, Wiesbaden-Biebrich, Germany, assignors, by mesne assignments, to Azoplate Corporation, Murray Hill, N.J., a corporation of New Jersey No Drawing. Filed July 2, 1964, Ser. No. 380,076
Claims priority, application Germany, July 4, 1963, K 50,128
46 Claims. (Cl. 96—33)

ABSTRACT OF THE DISCLOSURE

This invention relates to a novel light-sensitive material for use in the preparation of printing plates which comprises a support having a light-sensitive coating thereon containing a resin which is soluble in either a basic or acidic aqueous liquid and also in an organic solvent, and a light-sensitive nitrone.

Numerous organic compounds are known to undergo change or to decompose completely upon exposure to light. Exemplary of such compounds are diazo compounds, aromatic o-nitroaldehydes, and the amides and esters of 1,8-nitro-naphthalene sulfonic acid.

These compounds may be utilized for the preparation of printing plates by applying them, in admixture with a resin, to a suitable support and exposing the resulting light-sensitive material to a light image. This produces on the support a latent and sometimes invisible image in which the areas exposed to light have a different chemical constitution than the areas not effected by the light.

In the conversion of this latent image into a printing plate, the different solubility properties of the areas which have been exposed to light, compared to the other areas of the image, are employed and the former can accordingly be removed from the support by treatment with a suitable solvent. In the areas from which the light-sensitive substance has been removed by solvent treatment the image will take up water, provided the support has a hydrophilic surface, whereas the unexposed areas take up greasy ink due to the oleophilic properties of the light-sensitive substance which remains. The light-sensitivity of the aforementioned light-sensitive compounds is, however, imperfect and the printing plates prepared with them are sometimes insufficiently resistant to mechanical wear. Furthermore, they often possess only moderate thermal stability. The suitability of a light-sensitive organic compound for the photomechanical production of printing plates is therefore often largely determined by the other substances, and in particular the resin, which are incorporated in the light-sensitive layer.

The present invention provides a light-sensitive material for use in the preparation of printing plates which comprises a support having a light-sensitive coating containing a resin which is soluble in either a basic or an acidic aqueous liquid and also in an organic solvent, and a light-sensitive nitrone of the formula:

$$R_1-CH=\underset{\underset{O}{\downarrow}}{N}-R$$

in which $R_1$ is a substituted or unsubstituted aromatic hydrocarbon group or a heterocyclic group and R is a substituted or unsubstituted aromatic hydrocarbon group. If desired, the light-sensitive coating may also contain sensitizing dyes and/or film-forming substances.

The above mentioned nitrones are believed to decompose as follows upon exposure to light:

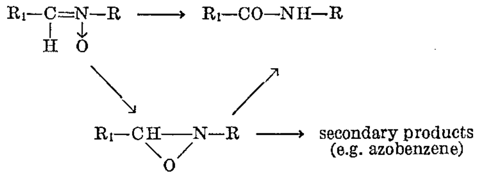

These nitrones are fairly easily synthesized and are inexpensive to produce. Printing plates prepared from the light-sensitive material of the invention have an excellent shelf life and considerable resistance to changes in temperature. The nitrones are also highly sensitive to light so that a printing plate can be prepared using a short exposure time.

Removal of the coating from the non-image areas by treatment with basic or acidic aqueous solvents can be affected quickly and completely and no subsequent treatment of the non-printing areas of the printing plate is necessary to render them hydrophilic. The presence of the resin in the light-sensitive coating ensures a homogeneous stable solution of the nitrone in the coating, and the nitrone does not tend to crystallize.

The printing areas of the light-sensitive coating have a high resistance to the decoating solvent, so that no damage is done to these areas of the coating even when the image is subjected to prolonged contact with the decoating solution. The printing areas have a high resistance to abrasion so that long printing runs are obtained. It may be that the resin reacts with the light-sensitive nitrone or its decomposition products during exposure to provide an increased physical and chemical differentiation between the image and non-image areas. By adding selected organic dyes which have a sensitizing effect a considerable additional increase of sensitivity can be obtained.

The nitrones can be prepared in known manner, e.g. by reaction of an aromatic aldehyde with an aryl-hydroxyl-amine.

One mode of preparation is as follows: 5 gm. of 2-thiophenaldehyde and 4.9 gm. of phenylhydroxylamine are dissolved in 10 ml. of methanol. After some time the nitrone crystallizes and can be recrystallized from aqueous methanol. The yield varies between 70 and 80% of the theoretical.

Exemplary of aromatic hydrocarbon groups $R_1$ in the above formula are: phenyl, naphthyl, anthracyl, and phenanthryl and groups of higher ring systems, such as naphthacene, chrysene, pyrene, perylene, coronene or acenapththene. Exemplary of heterocyclic groups $R_1$ are groups derived from furan, pyrrole, thiophene, pyazole, imidazole, triazole, thiazole, oxazole, iso-oxazole, indole, thionaphthene, benzofuran, indazole, carbazole, dibenzofuran, pyridine, pyridazine, pyrimidine, pyrazine, quinoline, quinazoline, acridine and phenazine.

The aforementioned hydrocarbon and heterocyclic groups may contain the following substituents: A straight or branched, saturated or unsaturated, aliphatic hydrocarbon radical, preferably containing not more than 8 carbon atoms in the longest chain, e.g. a methyl, ethyl, propyl, isopropyl, butyl, 1,3-methyl-hexyl or propenyl (1) group, a saturated or unsaturated cyclic hydrocarbon group, e.g. a cyclopentyl, cyclohexyl, dimethycyclohexyl, cyclopentene or cyclohexadiene group; an alkoxy, hydroxyalkyl or alkoxyalkyl group, e.g. a methoxy, ethoxy, propoxy, hydroxymethyl, hydroxyethyl, hydroxyisopropyl, methoxymethyl or ethoxymethyl group; a heterocyclic group; particularly in hydrogenated form, e.g. a morpholine group; an aromatic heterocyclic group, e.g. a pyridyl group; an aromatic hydrocarbon group, e.g. an aryl, alkaryl, aralkyl, alkaralkyl, alkoxyaryl, or hydroxyalkaryl group, e.g. a phenyl, naphthyl, tolyl, xylyl, benzyl, methoxyphenyl, methoxy-anthracyl or phenylmethoxy group; a halogenated aryl group, e.g. a chlorophenyl, bromophenyl or dichlorophenyl radical; a halogen atom, e.g. chlorine or bromine, a nitro, N-hydroxy or cyano group; or an amino, alkylamino, dialkylamino, arylamino, diarylamino or aralkylamino group, e.g. a methylamino, propylamino, dimethylamino, diethylamino, dipropylamino methylbutyl-amino, phenylamino, naphthylamino or benzyl-ethyl-amino group. The following table gives examples of a number of nitrones which can be used in accordance with the present invention:

| Formula | $R_1$ | R | Fp, °C. |
|---|---|---|---|
| 1 | 2-nitro-phenyl | Phenyl | 92 |
| 2 | 3-nitro-phenyl | do | 144–145 |
| 3 | 4-nitro-phenyl | do | 186 |
| 4 | 4-dimethylamino-phenyl | do | 129–130 |
| 5 | 4-cyano-phenyl | do | 147 |
| 6 | 4-hydroxy-phenyl | do | 206 |
| 7 | 2-hydroxy-phenyl | do | 119 |
| 8 | 3-methoxy-4-hydroxy-phenyl | do | 200 |
| 9 | 3-4-dihydroxymethylene-phenyl | do | 120–124 |
| 10 | 3-methoxy-4-hydroxy-phenyl | 4-methyl-phenyl. | 173–174 |
| 11 | 4-acetamino-phenyl | Phenyl | 195 |
| 12 | 4-oxyacryloyl-phenyl | do | 145 |
| 13 | 4-(methyl-benzyl-amino)-phenyl | do | 110–113 |
| 14 | 4-diphenyl | do | 190–191 |
| 15 | 4-hydroxy-naphthyl | 4-methyl-phenyl. | 137–139 |
| 16 | (2′-diazo-1′-oxo-naphthalene-4′-sulfonyl)-4-oxyphenyl. | Phenyl | [1] 150 |
| 16a | do | do | 118–119 |
| 17 | 2-phenyl-ethenyl | do | 151–151.1 |
| 18 | 2-(2′-nitro-phenyl)-ethynyl | do | 86 |
| 19 | 2,2-diphenyl-ethenyl | do | 135–136 |
| 20 | 2-naphthyl-6-methinimino-N-phenyl-N-oxide. | do | 227 |
| 21 | Methylimino-N-phenyl-N-oxide | do | 175–176 |
| 22 | Methylimino-N-4-methyl-phenyl)-N-oxide. | 4-methyl-phenyl. | 184–185 |
| 23 | 2-furyl | Phenyl | 87–88.5 |
| 24 | 2-thiophenyl | do | 88–89 |
| 25 | 5-chloro-thiophenyl-2 | do | 114 |
| 26 | 5-iodine-thiophenyl-2 | do | 168–170 |
| 27 | 5-methoxy-thiophenyl-2 | do | 203 |
| 28 | 5,3-bis-carboxyethyl-4-methyl-pyrrole-2. | do | 122–123 |
| 29 | Pyridyl-3 | do | 113.5 |
| 30 | 6-(methinimo-N-phenyl-N-oxide)-pyridyl-2. | do | 164–165 |
| 31 | Thionaphthenyl-3 | do | 84–85 |
| 32 | Indolyl-3 | do | 182–184 |
| 33 | 2-methyl-indolyl-3 | do | 167–168 |
| 34 | Quinolyl-4 | do | 143–144 |
| 35 | Quinolyl-2 | do | 146 |
| 36 | Benzimidazolyl-2 | do | 224–225 |
| 37 | Benzthiazolyl-2 | 4-methyl-phenyl. | 68–70 |
| 38 | N-methyl-carbazolyl-3 | Phenyl | 119–120 |
| 39 | N-ethyl-carbazolyl-3 | do | |
| 40 | Anthracenyl-9 | do | 224–226 |
| 41 | do | 4-methyl-phenyl. | >200 |
| 42 | Pyrenyl-1 | Phenyl | 159–161 |

[1] Decomposition point.

The foregoing compounds have the following structural formulae:

Formula 1

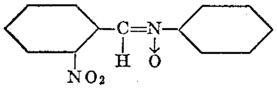

Formula 2

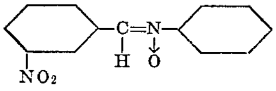

Formula 3

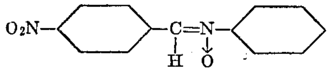

Formula 4

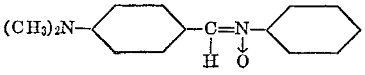

Formula 5

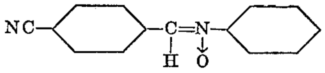

Formula 6

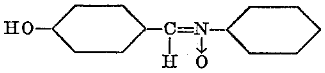

Formula 7

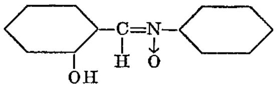

Formula 8

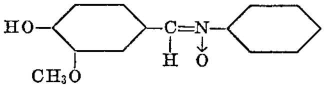

Formula 9

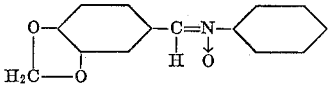

Formula 10

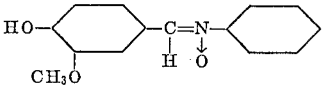

Formula 11

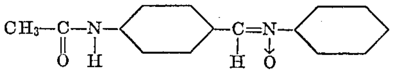

Formula 12

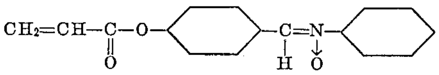

Formula 13

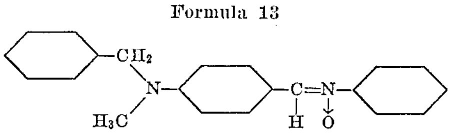

Formula 14

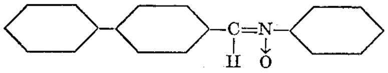

Formula 15

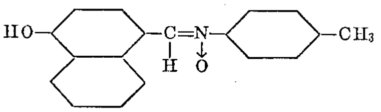

Formula 16

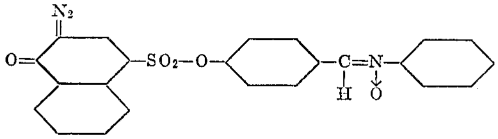

Formula 16a

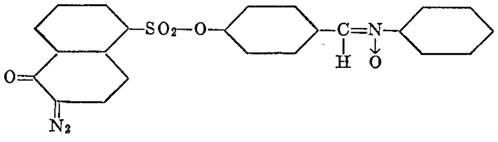

Formula 17

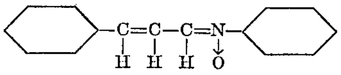

Formula 18

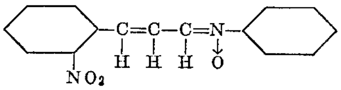

Formula 19
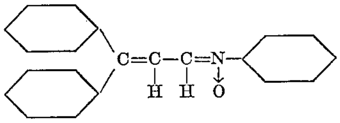
Formula 20
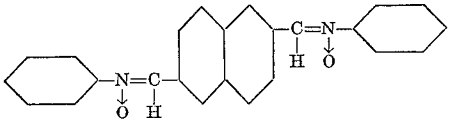
Formula 21
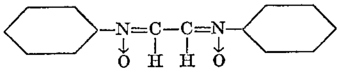
Formula 22
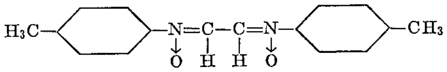
Formula 23
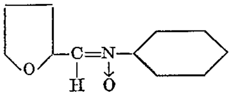
Formula 24
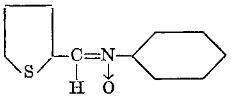
Formula 25
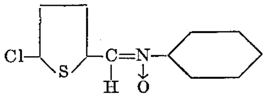
Formula 26
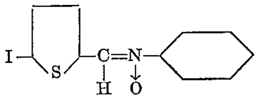
Formula 27
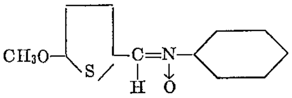
Formula 28
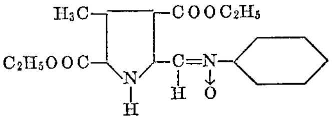
Formula 29
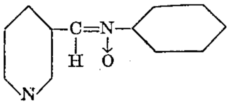
Formula 30
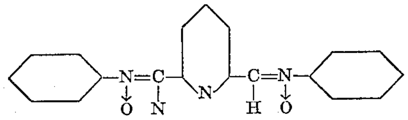
Formula 31
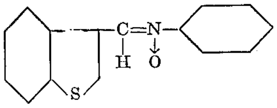
Formula 32
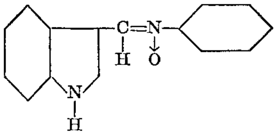
Formula 33
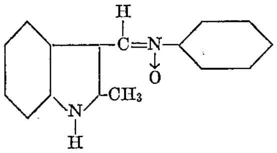
Formula 34
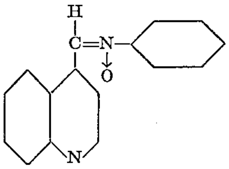
Formula 35
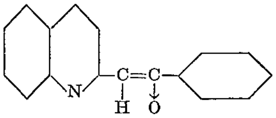
Formula 36
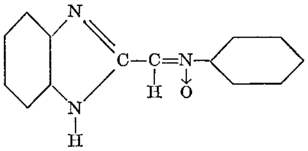
Formula 37
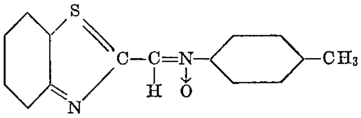
Formula 38
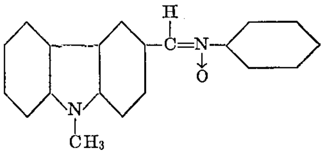
Formula 39
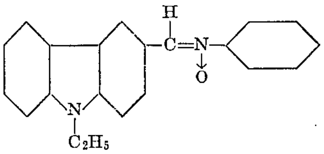
Formula 40
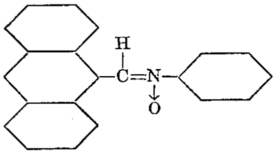
Formula 41
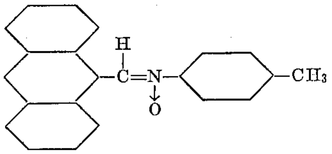

Formula 42

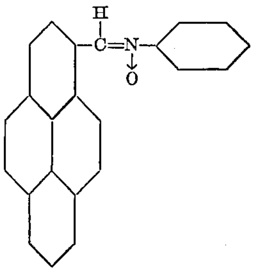

Mixtures of the aforementioned light-sensitive nitrones can also be used. It is also possible to include in the coating small quantities of other light-sensitive compounds, for example quinone diazides.

The coating contains at least one resin, which is either soluble in an alkaline or an acidic aqueous solution. Perferably the resins are polymers or polycondensate derived from monomers containing aromatic nuclei. When an alkaline aqueous solvent is to be used, the groups promoting solubility of the resin may be, for example, acid anhydride, carboxyl, sulfonamide or sulfonimide groups. Resins containing these groups may be, for example, derived from vinyl polymers and vinyl copolymers. Particularly suitable resins are copolymers of styrene and maleic acid anhydride, and resins containing acid groups, such as phthalic acid ester resins, polycarbonic acid esters, maleinate resins, alkyd resins and colophony resins. Highly polymerized poly acrylic acid can also be used, alone or in admixture with other resins. The copolymers of styrene and maleic acid anhydride have proved to be very suitable resins, particularly those containing approximately 1.0 mole of maleic acid anhydride per mole of styrene. Equally good results are obtained with condensates of formaldehyde with phenol or metacresol, reacted with chloroacetic acid. Resins containing e.g. amino groups are soluble in an aqueous acidic solvent, examples being vinyl polymers containing aromatic radicals which contain amino substituent groups, such as polyaminostyrene, or basic heterocyclic substituent groups, such as polyvinyl pyridine. These resins are also soluble in organic solvents.

The proportions of resin and nitrone in the layer may vary within wide limits. Mixtures within the range of 2 parts by weight of resin and 1 part by weight of nitrone to 2 parts by weight of nitrone compound and 1 part by weight of resin are preferred.

The following are exemplary of sensitizing dyes which may be included in the coating:

| | I | | II |
|---|---|---|---|
| Nile Blue BX | 1029N | Page 698 | 51180 |
| Methylene Green | 1040 | Page 451 | 52020 |
| Methylene Blue IaD | | | 52015 |
| Crystal Violet | 785 | Page 329 | 42555 |
| Safranine | 967 | Page 417 | 50240 |
| Auramine | 752 | Page 307 | 41000 |
| Gallocyanine | 998 | Page 433 | 51030 |
| Rhodamine 3G | 864 | Page 365 | 45210 |
| Victoria Blue BOX | 822 | Page 347 | 42595 |

Column I in the above table gives the numbers and pages identifying the dyes in the tables compiled by G. Schultz, "Farbstofftabellen," 7th ed. (1931), vol. I; and Column II gives the numbers according to the Color Index, vol. IV. These dyes have a sensitizing effect on the material of the invention, despite the fact that in photography they are known to be either desensitizing (for example Nile Blue BX or Safranine) or inactive (for example Auramine or Victoria Blue BOX).

To increase the film-forming properties of the coating it may include, in addition to the nitrone and the resin which is soluble in one of the aforementioned solvents, a small amount of a natural, semi-synthetic or synthetic resin, such for example as balsam resin, colophony, shellac, a phenol resin modified with colophony, a coumarone resin, an indene resin or any of the substances known as "synthetic varnish resins." These latter resins iinclude: modified natural substances, such as cellulose ether, polymers, polycondensates, for example phthalic resins, terephthalic acid ester resins and isophthalic acid-ethylene-glycolpolyester resins, maleinate resins, maleic acid-colophony mixed esters of higher alcohols, phenol-formaldehyde resins, urea-formaldehyde resins, aldehyde resins, ketone resins, polyamides and polyurethanes.

Only basic or acidic aqueous solvents and organic solvents are suitable as decoating solvents. The following are exemplary of suitable basic aqueous solvents: secondary and tertiary alkali metal salts of phosphoric acid or silicic acid, for example silicates, such as sodium silicate, or phosphates, such as trisodium phosphate. Aqueous solutions of organic bases, such as mono- and diethanolamine, can also be used. Exemplary of suitable acid aqueous solvents are aqueous solutions of acids, such as phosphoric acid, sulfuric acid and maleic acid. In some cases aqueous solutions or emulsions of organic solvents, in particular glycolmonomethyl ether or butyl acetate can be used.

Exemplary of suitable organic solvents are methanol, ethanol, propanol, isopropanol and butanol, and mixtures thereof.

The concentration of the decoating solvent may vary widely. Thus, 1 to 10% by weight solutions in water of the acidic or basic substance yield very good results. The aqueous solution may also include an organic solvent, e.g. in an amount up to 20 percent by volume.

The light-sensitive material may be prepared and used for printing purposes as follows: The nitrone and resin employed are e.g. dissolved in a solvent and applied as a thin layer to a support.

The support may be a plate of aluminum, zinc or copper, a bimetallic plate, or, in particular, an aluminum plate having a chemically or electrochemically produced surface coating of aluminum oxide. Precoated paper may also be used as the support.

The latent image is produced on the light-sensitive coating by exposing it image-wise by contact, episcopically or diascopically. The light source may be an arc lamp or a mercury vapor lamp. To convert the latent image into a printing plate, it is wiped over with an acidic or basic aqueous solvent which removes the coating from the support in the unexposed areas but leaves the exposed areas unaffected. The printing plate may then be linked up with greasy ink and used for printing in an offset machine.

When a metal support is used, the bared portions of the support can be etched and subsequently used for letterpress and intaglio printing. In all cases, long runs of high-contrast images with sharp edges are obtained.

In the following examples, parts by weight are in grams and parts by volume in ml.

Example 1

One part by weight of the nitrone of Formula 6 and 1.2 parts by weight of an alkali-soluble novolak (i.e. a phenol-formaldehyde condensation product) are dissolved in 100 parts by volume of ethylene glycol monomethyl ether. A mechanically roughened aluminum foil is coated with this solution on a whirl-coater, dried with hot air, and then dried for an additional 2 minutes at 100° C. to ensure complete removal of the solvent. This light-sensitive foil is exposed to an 18 amp. carbon arc lamp at a distance of 70 cm., and under a negative transparent film original, for approximately 2 minutes. The resulting brown-colored image is developed by wiping it over with a 5% aqueous solution of trisodium phosphate. The plate can then be inked up with greasy ink and used for printing in an offset machine. Even better results are obtained by wiping the plate over with a 1% phosphoric acid solution before inking. The plate may be stored for a prolonged period and at an elevated temperature without damage to the coating.

Example 2

1.0 part by weight of the nitrone of Formula 8 and 1.5 parts by weight of the novolak resin used in Example 1 are dissolved in 100 parts by volume of a 1:1 mixture of ethylene glycol monomethyl ether and dimethyl formamide, and 0.01 part by weight of Nile Blue BX are added to this solution. An aluminum foil is coated with this solution as described in Example 1, dried, and then exposed for 2 minutes to a carbon arc lamp under a negative transparent film original. The foil is developed by wiping it over with a 5% solution of trisodium phosphate, then treated with phosphoric acid as in Example 1, and used in an offset printing machine after inking up with greasy ink. If the dyestuff sensitizer is omitted, the plate must be exposed for 3 minutes under otherwise identical conditions, in order to obtain an equally good printing plate.

Example 3

One part by weight of the nitrone of Formula 11 and 0.2 part by weight of a condensation product of the resin described in Example 1 and monochloroacetic acid are dissolved in glycol monomethyl ether (100 parts by volume) and applied to an aluminum foil as described in Example 1, exposed for 2 minutes and developed by wiping it over with a 1% aqueous solution of sodium metasilicate·$9H_2O$. The resulting plate can be used in an offset printing machine and long runs of prints with sharp edges are obtained.

Example 4

A sheet of paper which has been provided on one side with a formaldehyde-hardened coating of casein and clay, is coated on a whirler with a solution of 1.0 part by weight of the nitrone of Formula 17 and 1.0 part by weight of the resin described in Example 3, in 100 parts by volume of ethylene glycol monomethyl ether. The coating is dried and exposed as described in Example 1. After development with a 5% aqueous solution of trisodium phosphate, and, if desired, after-treatment with 1% phosphoric acid solution, the resulting printing plate can be used in an offset machine. Long runs of prints of high covering power are obtained.

Example 5

As described in Example 1, a solution of 1.0 part of the nitrone of Formula 19 and 0.2 part of a polycondensation product, obtained by the reaction of N-ethylaniline with formaldehyde, in 100 parts by volume of glycol monomethyl ether is applied to a metal support, dried and exposed. The plate is developed by wiping it over with a 5% aqueous solution of phosphoric acid. After inking up with greasy ink, the plate can be used in an offset printing machine. Long runs of prints with sharp edges are obtained.

Example 6

A solution of 1.0 part by weight of the nitrone of Formula 21 and 0.5 part by weight of the resin described in Example 3, in a mixture of 50 parts by volume of ethylene glycol monomethyl ether and 50 parts by volume of dimethyl formamide, is applied to an aluminum foil as described in Example 1, dried, exposed and developed by wiping it over with a 5% aqueous solution of trisodium phosphate. It can then be used as described in Example 1.

Example 7

1.5 parts by weight of the nitrone of Formula 25 and 5.2 parts by weight of the resin described in Example 1 are dissolved in 100 parts by volume of ethylene glycol monomethyl ether. A thoroughly cleaned, polished zinc plate is coated with this solution and dried as described in Example 1. Then, it is exposed for 10 minutes under a negative transparent film original to a carbon arc lamp. After removal of the unexposed parts of the coating with a solution consisting of 85 percent by volume of a 5% aqueous solution of trisodium phoshate and 15 percent by volume of ethylene glycol monomethyl ether, an image is obtained which, due to the high resistance of the light-reaction product and the resin, can be converted into a printing plate by deep etching with 6% nitric acid. Long runs of excellent prints are obtained.

Example 8

As described in Example 1, a metal support is coated with a solution of 1.0 part of the nitrone of Formula 26 and 0.5 part by weight of the resin described in Example 3, in 100 parts by volume of ethylene glycol monomethyl ether, and then dried and exposed. The plate is developed by wiping it over with a 5% aqueous solution of trisodium phosphate. After further treatment, as described in Example 1, the plate can be used in an offset printing machine.

Example 9

1.0 part by weight of the nitrone of Formula 28 and 0.2 part by weight of the resin described in Example 3 are dissolved in a mixture of 50 parts by volume of ethylene glycol monomethyl ether and 50 parts by volume of dimethyl formamide, coated onto an aluminum plate, as described in Example 1, and dried. After exposure the plate is developed by wiping it over with a 10% aqueous solution of trisodium phosphate, treated with 1% phosphoric acid solution and used in an offset printing machine, after inking up with greasy ink.

Example 10

As described in Example 1, a solution of 1.0 part of the nitrone of Formula 30 and 1.0 part by weight of the resin described in Example 3, in 100 parts by volume of ethylene glycol monomethyl ether, is applied to a metal support, dried, and exposed. The plate is developed by wiping it over with a 10% aqueous solution of trisodium phosphate and is prepared for printing as described in Example 1.

Example 11

One part by weight of the nitrone of Formula 35 and 0.5 part by weight of the resin described in Example 3 are dissolved in 100 parts by volume of ethylene glycol monomethyl ether, applied to an aluminum foil, dried, and exposed for 2 minutes. The plate is developed by wiping it over with a 5% aqueous solution of sodium metasilicate·$9H_2O$, inked up with greasy ink and used in an offset printing machine.

Example 12

As described in Example 1, a solution of 1.0 part of the nitrone of Formula 40 and 2 parts of the resin described in Example 3, in a mixture of 50 parts by volume of ethylene glycol monomethyl ether and 50 parts by volume of dimethyl formamide, is applied to a metal support, dried, and exposed for 2 minutes to a carbon arc lamp. The plate is developed by wiping it over with a solution consisting of 85 percent by volume of a 5% aqueous solution of trisodium phosphate and 15 percent by volume of ethylene glycol monomethyl ether. After treatment with 1% phosphoric acid solution, the plate is inked up with printing ink and used in an offset printing machine.

Example 13

One part by weight of the nitrone of Formula 42 and 1.2 parts by weight of the resin described in Example 3 are dissolved in a mixture of 50 parts by volume of ethylene glycol monomethyl ether and 50 parts by volume of dimethyl formamide, and the solution is applied to a metal support as described in Example 1, dried, and exposed for 2 minutes to a carbon arc lamp. The plate is developed by wiping it over with a mixture of 80 percent by volume of a 5% aqueous solution of trisodium phosphate and 20 percent by volume of ethylene glycol monomethyl ether. After treatment with 1% phosphoric acid solution, the plate can be inked up with greasy ink and used in an offset printing machine.

Example 14

0.5 part by weight of the nitrone of Formula 4, 0.5 part by weight of the nitrone of Formula 20, and 1.0 part by weight of the resin described in Example 3 are dissolved in 100 parts by volume of a mixture of 20 percent by volume of butyl acetate and 80 percent by volume of ethylene glycol monomethyl ether. This solution is applied to a metal support, dried, and exposed for 10 minutes under a carbon arc lamp. The plate is developed by wiping it over with a 5% aqueous solution of sodium metasilicate·$9H_2O$. After inking up with greasy ink, the plate can be used in an offset printing machine.

Example 15

As described in Example 1, a solution of 0.8 part by weight of the nitrone of Formula 10, 0.2 part by weight of 2,5-dimethoxy - 4 - toluene-sulfiminobenzoquinonediazide-1 and 1.0 part by weight of the resin described in Example 1 in 100 parts by volume of ethylene glycol monomethyl ether is applied to a metal support, dried, and exposed for 3 minutes under a carbon arc lamp. The plate is developed by wiping it over with a 5% aqueous solution of trisodium phosphate. After treatment with 1% phosphoric acid solution, the plate can be inked up with greasy ink and used in an offset printing machine.

It will be obvious to those skilled in the art that many modifications may be made within the scope of the present invention without departing from the spirit thereof, and the invention includes all such modifications.

What is claimed is:

1. Light-sensitive material comprising a base material having a layer thereon including a synthetic aromatic resin soluble in a solvent selected from the group consisting of an organic solvent and acidic and basic aqueous liquids, and a light-sensitive nitrone having the formula

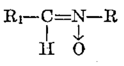

in which $R_1$ is selected from the group consisting of aryl and heterocyclic groups, and R is an aryl group, the proportion of resin to nitrone being in the range of 0.5 to 2 parts per part, respectively, by weight.

2. Light-sensitive material according to claim 1 in which the layer contains a dyestuff sensitizer.

3. Light-sensitive material according to claim 1 in which the layer contains, in addition, a film-forming resin.

4. Light-sensitive material according to claim 1 in which the nitrone has the formula

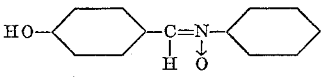

5. Light-sensitive material according to claim 1 in which the nitrone has the formula

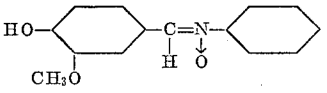

6. Light-sensitive material according to claim 1 in which the nitrone has the formula

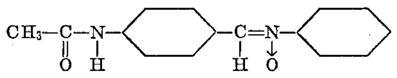

7. Light-sensitive material according to claim 1 in which the nitrone has the formula

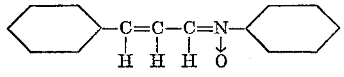

8. Light-sensitive material according to claim 1 in which the nitrone has the formula

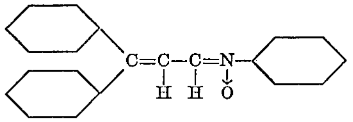

9. Light-sensitive formula according to claim 1 in which the nitrone has the formula

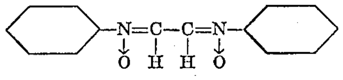

10. Light-sensitive material according to claim 1 in which the nitrone has the formula

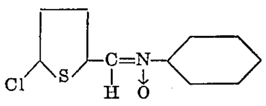

11. Light-sensitive material according to claim 1 in which the nitrone has the formula

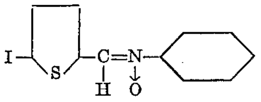

12. Light-sensitive material according to claim 1 in which the nitrone has the formula

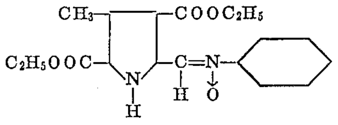

13. Light-sensitive material according to claim 1 in which the nitrone has the formula

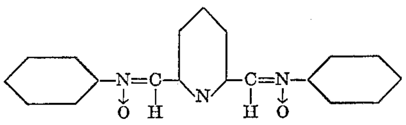

14. Light-sensitive material according to claim 1 in which the nitrone has the formula

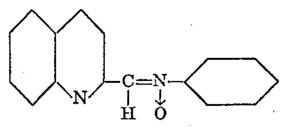

15. Light-sensitive material according to claim 1 in which the nitrone has the formula

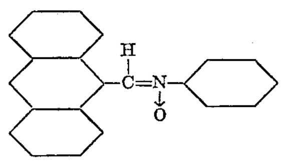

16. Light-sensitive material according to claim 1 in which the nitrone has the formula

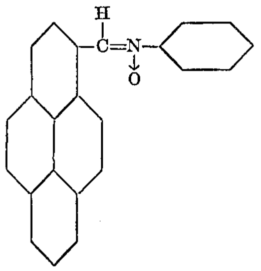

17. Light-sensitive material according to claim 1 in which the nitrone has the formula

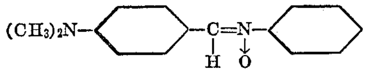

18. Light-sensitive material according to claim 1 in which the nitrone has the formula

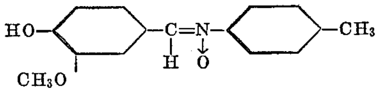

19. Light-sensitive material according to claim 1 in which the nitrone has the formula

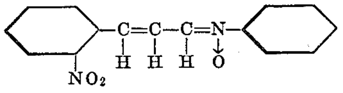

20. Light-sensitive material according to claim 1 in which the nitrone has the formula

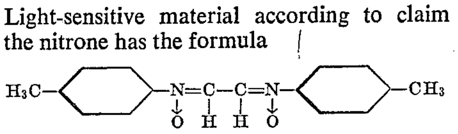

21. Light-sensitive material according to claim 1 in which the resin is an alkali-soluble novolak.

22. Light-sensitive material according to claim 1 in which the resin is a condensation product of an alkali-soluble novolak and chloroacetic acid.

23. Light-sensitive material according to claim 1 in which the resin is a polycondensation product obtained by reaction of N-ethylaniline and formaldehyde.

24. A process for making a printing plate which comprises exposing a supported light-sensitive layer to light under a master and treating the exposed layer with a solvent selected from the group consisting of an organic solvent and acidic and basic aqueous liquids, the layer including a synthetic aromatic resin soluble in the solvent and a light-sensitive nitrone having the formula $$R_1-\underset{\substack{|\\H}}{C}=\underset{\substack{\downarrow\\O}}{N}-R$$

in which $R_1$ is selected from the group consisting of aryl and heterocyclic groups, and R is an aryl group, the proportion of resin to nitrone being in the range of 0.5 to 2 parts part, respectively, by weight.

25. A process according to claim 24 in which the layer contains a dyestuff sensitizer.

26. A process according to claim 24 in which the layer contains, in addition, a film-forming resin.

27. A process according to claim 24 in which the nitrone has the formula

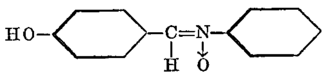

28. A process according to claim 24 in which the nitrone has the formula

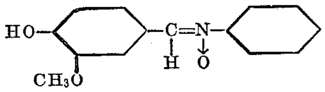

29. A process according to claim 24 in which the nitrone has the formula

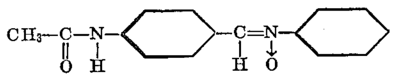

30. A process according to claim 24 in which the nitrone has the formula

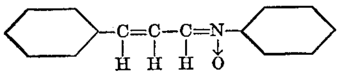

31. A process according to claim 24 in which the nitrone has the formula

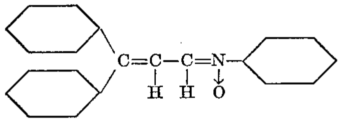

32. A process according to claim 24 in which the nitrone has the formula

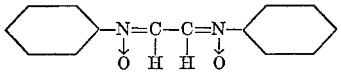

33. A process according to claim 24 in which the nitrone has the formula

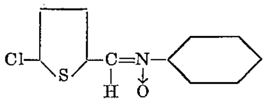

34. A process according to claim 24 in which the nitrone has the formula

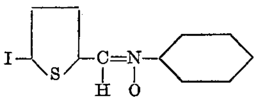

35. A process according to claim 24 in which the nitrone has the formula

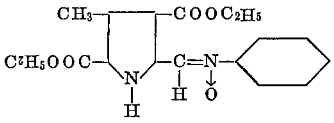

36. A process according to claim 24 in which the nitrone has the formula

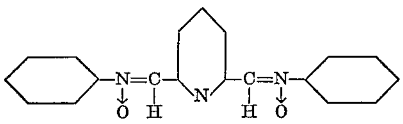

37. A process according to claim 24 in which the nitrone has the formula

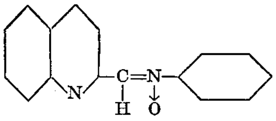

38. A process according to claim 24 in which the nitrone has the formula

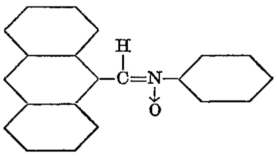

39. A process according to claim 24 in which the nitrone has the formula

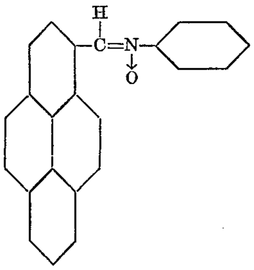

40. A process according to claim 24 in which the nitrone has the formula

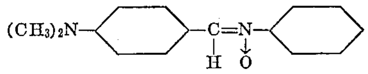

41. A process according to claim 24 in which the nitrone has the formula

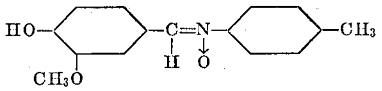

42. A process according to claim 24 in which the nitrone has the formula

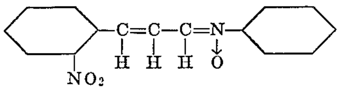

43. A process according to claim 24 in which the nitrone has the formula

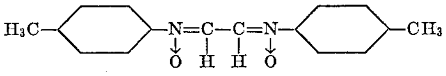

44. A process according to claim 24 in which the resin is an alkali-soluble novolak.

45. A process according to claim 24 in which the resin is a condensation product of an alkali-soluble novolak and chloroacetic acid.

46. A process according to claim 24 in which the resin is a polycondensation product obtained by reaction of N-ethylaniline and formaldehyde.

References Cited

UNITED STATES PATENTS 3,158,484 11/1964 Willems et al. ------- 96—114
3,175,905 3/1965 Stahlhofen ------------ 96—75

FOREIGN PATENTS 449,812 5/1945 Canada.

OTHER REFERENCES

Hamer et al., "Nitrones." Chem. Rev., 64, 1964, pp. 473–475.

NORMAN G. TORCHIN, *Primary Examiner.*

C. E. DAVIS, *Assistant Examiner.*

U.S. Cl. X.R.

96—88, 90, 36.3; 260—566, 78.5, 77.5, 80, 59, 88.3